United States Patent
Kuang

(10) Patent No.: US 12,255,641 B2
(45) Date of Patent: Mar. 18, 2025

(54) ISOLATED DRIVE CIRCUIT AND ISOLATED DRIVING METHOD WITH IMPROVED MAGNETIC FIELD IMMUNITY

(71) Applicant: Chengdu Monolithic Power Systems Co., Ltd., Chengdu (CN)

(72) Inventor: Naixing Kuang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 251 days.

(21) Appl. No.: 17/950,510

(22) Filed: Sep. 22, 2022

(65) Prior Publication Data

US 2023/0101006 A1  Mar. 30, 2023

(30) Foreign Application Priority Data

Sep. 28, 2021  (CN) .......................... 202111148376.3

(51) Int. Cl.
*H03K 17/689* (2006.01)

(52) U.S. Cl.
CPC ................................. *H03K 17/689* (2013.01)

(58) Field of Classification Search
CPC .. H03K 17/689; H03K 17/605; H03K 17/722; H02M 1/44; H02M 1/08; H02M 3/33523
See application file for complete search history.

(56) References Cited

U.S. PATENT DOCUMENTS

| | | |
|---|---|---|
| 7,236,041 B2 | 6/2007 | Kim et al. |
| 10,931,204 B1 | 2/2021 | Han et al. |
| 11,258,368 B2 | 2/2022 | Jiang et al. |
| 2022/0115941 A1* | 4/2022 | May ..................... H03K 17/689 |

FOREIGN PATENT DOCUMENTS

CN          113162378 A  *  7/2021  ............ H02M 1/088

* cited by examiner

*Primary Examiner* — Daniel D Chang
(74) *Attorney, Agent, or Firm* — Perkins Coie LLP

(57) ABSTRACT

A drive circuit configured to drive a power stage including a high voltage power switch device. The drive circuit has a transmitter configured to send a control signal, and a receiver configured to transfer a received signal to a drive signal by a first isolated capacitor loop and a second isolated capacitor loop. The first isolated capacitor loop has a same area as the second isolated capacitor loop.

19 Claims, 5 Drawing Sheets

ISOLATED DRIVE CIRCUIT AND ISOLATED DRIVING METHOD WITH IMPROVED MAGNETIC FIELD IMMUNITY

CROSS-REFERENCE TO RELATED APPLICATIONS

This application claims priority to and the benefit of Chinese Patent Application No. 202111148376.3, filed Sep. 28, 2021, which is incorporated herein by reference in its entirety.

FIELD

The present invention relates to electronic circuits, more specifically, the present invention relates to isolated drive circuit and the method thereof.

BACKGROUND

In high power applications, power switch devices need to sustain very high powers (e.g. several kilowatts to hundreds of kilowatts), while the power level of the control circuits is low, which is typically maintained below the safety voltage. Thus, electric isolation is needed when control signals are delivered to the power switch devices from the control circuits.

Conventional drivers adopt isolated capacitors to perform electrical isolation. FIG. 1 schematically shows an isolated driver 50 in the prior art. As shown in FIG. 1, the isolated driver 50 comprises: a transmitter 501 at a primary side, configured to output a control signal CTL; a receiver 502 at a secondary side, configured to receive the control signal CTL via a first capacitor 51, a second capacitor 52, a third capacitor 53, a fourth capacitor 54, and a resistor 55, to generate a drive signal $G_D$, which is used to drive a power switch device (not shown). However, if the isolated driver 50 is at an environment with a magnetic field, an induced voltage $V_n$ would be generated in a loop formed by the capacitors 51-54 due to electro-magnetic induction effect. The induced voltage $V_n$ would have a voltage drop at the resistor 55, which may cause the receiver 502 to falsely trigger the power switch device, which brings potential risk.

SUMMARY

In accordance with an embodiment of the present invention, an isolated drive circuit is discussed. The isolated drive circuit comprises: a transmitter at a primary side, a receiver at a secondary side, and a first isolated capacitor loop and a second isolated capacitor loop placed between the transmitter and the receiver. The transmitter is configured to send a control signal. The receiver is configured to sample a voltage difference between a first voltage indicative of the control signal delivered by the first isolated capacitor loop and a second voltage indicative of the control signal delivered by the second isolated capacitor loop.

In accordance with another embodiment of the present invention, an isolated drive circuit is discussed. The isolated drive circuit comprises: a first transmit circuit and a second transmit circuit, respectively configured to provide a first control signal and a second control signal. The isolated drive circuit further comprises: a first isolated capacitor loop, placed between the first transmit circuit and a receiver; a second isolated capacitor loop, placed between the second transmit circuit and the receiver. The receiver is also included in the isolated drive circuit, which is configured to sample a voltage difference between a first voltage indicative of the first control signal delivered by the first isolated capacitor loop and a second voltage indicative of the second control signal delivered by the second isolated capacitor loop.

In accordance with yet another embodiment of the present invention, an isolated driving method is discussed. The method comprises: sending a control signal at a primary side, and delivering the control signal to a secondary side by way of a first isolated capacitor loop to obtain a first signal; sending the control signal at the primary side, and delivering the control signal to the secondary side by way of a second isolated capacitor loop to obtain a second signal; and sampling a voltage difference between the first signal and the second signal.

The use of the similar reference label in different drawings indicates the same of like components.

DETAILED DESCRIPTION

Embodiments of circuits for isolated drive circuit are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 1:
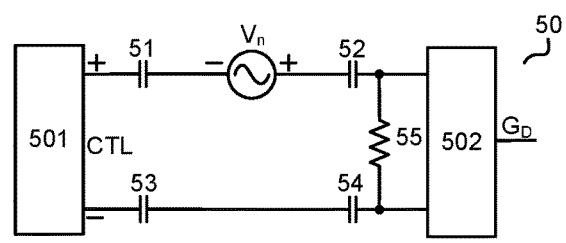
FIG. 1 schematically shows an isolated driver 50 in the prior art.
Figure 2:
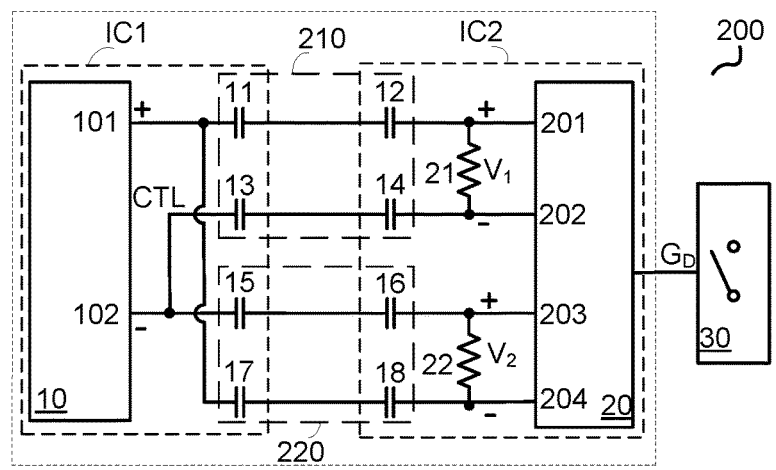
FIG. 2 schematically shows an isolated drive circuit 200 in accordance with an embodiment of the present invention.

FIG. 2 schematically shows an isolated drive circuit 200 in accordance with an embodiment of the present invention. In the example of FIG. 2, the isolated drive circuit 200 comprises: a transmitter 10 at a primary side, a receiver 20 at a secondary side, and a first isolated capacitor loop 210 and a second isolated capacitor loop 220 placed between the transmitter 10 and the receiver 20. The transmitter 10 is configured to send a control signal CTL. The receiver 20 is configured to sample a voltage difference between a first voltage $V_1$ indicative of the control signal CTL delivered by the first isolated capacitor loop 210 and a second voltage $V_2$ indicative of the control signal CTL delivered by the second isolated capacitor loop 220.

In one embodiment of the present invention, the first isolated capacitor loop 210 comprises a first capacitor pair (a first capacitor 11 and a second capacitor 12) and a second capacitor pair (a third capacitor 13 and a fourth capacitor 14). The second isolated capacitor loop 220 comprises a third capacitor pair (a fifth capacitor 15 and a sixth capacitor 16) and a fourth capacitor pair (a seventh capacitor 17 and an eighth capacitor 18).

In one embodiment of the present invention, the isolated drive circuit 200 is configured to generate a drive signal $G_D$, to drive a power stage 30.

In one embodiment of the present invention, the transmitter 10 is configured to provide the control signal CTL between a positive output terminal 101 (+) and a negative output terminal 102 (−). In the example of FIG. 2, the receiver 20 has a first receive terminal 201, a second receive terminal 202, a third receive terminal 203, and a fourth receive terminal 204. A first resistor 21 is placed between the first receive terminal 201 and the second receive terminal 202, to receive the control signal CTL delivered by the first isolated capacitor loop 210, and a voltage across the first resistor 21 is the first voltage $V_1$. A second resistor 22 is placed between the third receive terminal 203 and the fourth receive terminal 204, to receive the control signal CTL delivered by the second isolated capacitor loop 220, and a voltage across the second resistor 22 is the second voltage $V_2$. The receiver 20 is configured to perform a subtract operation on the first voltage $V_1$ and the second voltage $V_2$.

In one embodiment of the present invention, the first capacitor pair (the first capacitor 11 and the second capacitor 12) is coupled in series between the positive output terminal 101 and the first receive terminal 201. The second capacitor pair (the third capacitor 13 and the fourth capacitor 14) is coupled in series between the negative output terminal 102 and the second receive terminal 202. The third capacitor pair (the fifth capacitor 15 and the sixth capacitor 16) is coupled in series between the negative output terminal 102 and the third receive terminal 203. The fourth capacitor pair (the seventh capacitor 17 and the eighth capacitor 18) is coupled in series between the positive output terminal 101 and the fourth receive terminal 204.

In one embodiment of the present invention, the first capacitor 11 to the eighth capacitor 18 are capacitors in semiconductor level, which is formed by semiconductor mask process.

In one embodiment of the present invention, the transmitter 10, the first capacitor 11, the third capacitor 13, the fifth capacitor 15, and the seventh capacitor 17 are formed at a primary die, as shown with a dashed frame IC1 in FIG. 2. The receiver 20, the second capacitor 12, the fourth capacitor 14, the sixth capacitor 16 and the eighth capacitor 18 are formed at a secondary die, as shown with a dashed frame IC2 in FIG. 2.

In one embodiment of the present invention, the transmitter 10, the receiver 20, the first isolated capacitor loop 210 and the second isolated capacitor loop 220 are all co-packed in a package outline. That is, the transmitter 10, the receiver 20, the first isolated capacitor loop 210 and the second isolated capacitor loop 220 are packaged together in one package outline.

In the example of FIG. 2, each of the first capacitor pair, the second capacitor pair, the third capacitor pair and the fourth capacitor pair has two capacitors. However, one skilled in the art should realize that the two capacitors may be merged into one capacitor. That is, the first isolated capacitor loop 210 may comprise only the first capacitor 11 and the third capacitor 13 set between the transmitter 10 and the receiver 20; and the second isolated capacitor loop 220 may comprise only the fifth capacitor 15 and the seventh capacitor 17 set between the transmitter 10 and the receiver 20, as shown in an isolated drive circuit 300 in FIG. 3. One of the first capacitor 11, the third capacitor 13, the fifth capacitor 15, and the seventh capacitor 17 or some of them may be formed together with the transmitter 10 in the primary die, and the rest of them may be formed together with the receiver 20 in the secondary die. In other embodiments of the present invention, some of the capacitor pairs may have two capacitors, while some of the capacitor pairs may have one capacitor, as shown in an isolated drive circuit 400 in FIG. 4. The first isolated capacitor loop 210 comprises the first capacitor 11, the second capacitor 12 and the third capacitor 13 set between the transmitter 10 and the receiver 20. The second isolated capacitor loop 220 comprises the fifth capacitor 15, the seventh capacitor 17 and the eighth capacitor 18 set between the transmitter 10 and the receiver 20.

Figure 3:
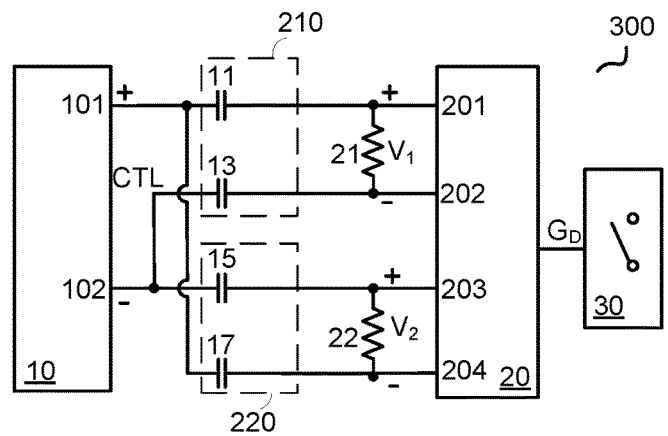
FIG. 3 schematically shows an isolated drive circuit 300 in accordance with an embodiment of the present invention.
Figure 4:
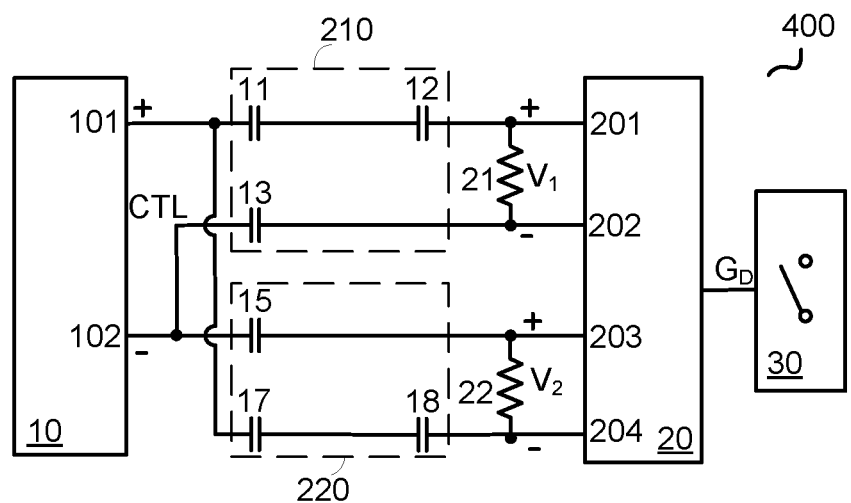
FIG. 4 schematically shows an isolated drive circuit 400 in accordance with an embodiment of the present invention.

FIG. 3 and FIG. 4 schematically show some of the combinations of the first to fourth capacitor pairs. However, one of the ordinary skill should realize that the first to fourth capacitor pairs may include any appropriate number of capacitors.

In one embodiment of the present invention, the first isolated capacitor loop 210 has a same area (i.e. physical area) as the second isolated capacitor loop 220.

Figure 5:
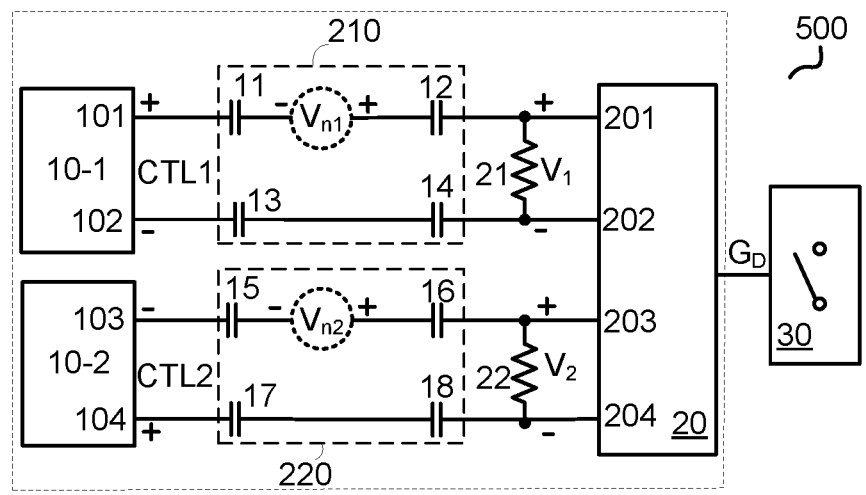
FIG. 5 schematically shows an isolated drive circuit 500 in accordance with an embodiment of the present invention.

In one embodiment of the present invention, the receiver 10 may comprise two transmit circuits, as shown in FIG. 5, which schematically shows an isolated drive circuit 500 in accordance with an embodiment of the present invention. In the example of FIG. 5, the isolated drive circuit 500 comprises: a first transmit circuit 10-1 and a second transmit circuit 10-2, respectively configured to provide a first control signal CTL1 and a second control signal CTL2. The isolated drive circuit 500 further comprises: a first isolated capacitor loop 210, set between the first transmit circuit 10-1 and a receiver 20; a second isolated capacitor loop 220, set between the second transmit circuit 10-2 and the receiver 20; and the receiver 20, configured to sample a voltage difference between a first voltage $V_1$ indicative of the first control signal CTL1 delivered by the first isolated capacitor loop 210 and a second voltage $V_2$ indicative of the second control signal CTL2 delivered by the second isolated capacitor loop 220. As shown in FIG. 5, the first control signal CTL1 is turned into the first voltage $V_1$ after delivered by the first isolated capacitor loop 210, and the second control signal CTL2 is turned into the second voltage $V_2$ after delivered by the second isolated capacitor loop 220.

In the example of FIG. 5, the first isolated capacitor loop 210 comprises: a first capacitor pair (a first capacitor 11 and a second capacitor 12) placed between a positive terminal 101 of the first transmit circuit 10-1 and a first receive terminal 201 of the receiver 20, and a second capacitor pair (a third capacitor 13 and a fourth capacitor 14) placed between a negative terminal 102 of the first transmit circuit 10-1 and a second receive terminal 202 of the receiver 20.

The second isolated capacitor loop 220 comprises: a third capacitor pair (a fifth capacitor 15 and a sixth capacitor 16) placed between a negative terminal 103 of the second transmit circuit 10-2 and a third receive terminal 203 of the receiver 20, and a fourth capacitor pair (a seventh capacitor 17 and an eighth capacitor 18) placed between a positive terminal 104 of the second transmit circuit 10-2 and a fourth receive terminal 204 of the receiver 20. In the example of FIG. 5, the first isolated capacitor loop 210 and the second isolated capacitor loop 220 are shown as they each comprises capacitor pairs. However, one skilled in the art should realize that the first isolated capacitor loop 210 and the second isolated capacitor loop 220 may include a single capacitor to replace the capacitor pair, as discussed hereinbefore with reference FIG. 3 and FIG. 4.

In the example of FIG. 5, the first isolated capacitor loop 210 has a same physical area as the second isolated capacitor loop 220.

In one embodiment of the present invention, the first transmit circuit 10-1, the second transmit circuit 10-2, the receiver 20, the first isolated capacitor loop 210 and the second isolated capacitor loop 220 are all co-packed in a package outline.

During the operation of the isolated drive circuit, if the circuit is placed at an environment with a certain magnetic field, a first induced voltage $V_{n1}$ would be generated at the first isolated capacitor loop 210, and a second induced voltage $V_{n2}$ would be generated at the second isolated capacitor loop 220, as shown with dashed circles in FIG. 5. Since the physical area of the first isolated capacitor loop 210 is almost same as that of the second isolated capacitor loop 220, if the two isolated capacitor loops are placed closed enough to each other, then $V_{n1} \approx V_{n2}$. That is, an electromagnetic induction component of the first voltage $V_1$ is counteracted with an electromagnetic induction component of the second voltage $V_2$. Thus, the actual effective voltage induced at the receiver 20 due to the electromagnetic field is almost zero. Thus, the false turn-on issue is eliminated.

Figure 6:
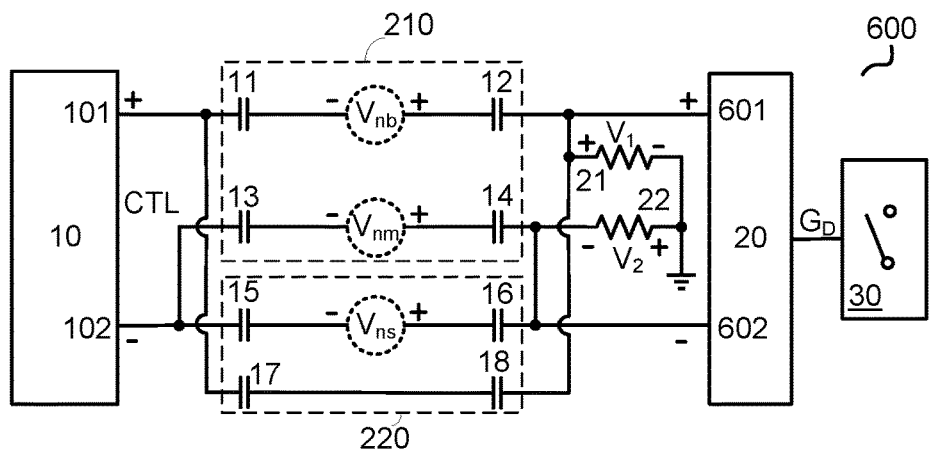
FIGS. 6-9 schematically shows an isolated drive circuit 600 in accordance with an embodiment of the present invention.

FIG. 6 schematically shows an isolated drive circuit 600 in accordance with an embodiment of the present invention. In the example of FIG. 6, the isolated drive circuit 600 comprises: a transmitter 10 at a primary side, a receiver 20 at a secondary side, a first isolated capacitor loop 210 and a second isolated capacitor loop 220 set between the transmitter 10 and the receiver 20. The transmitter 10 is configured to provide a control signal CTL. The receiver 20 is configured to sample a voltage difference between a first voltage $V_1$ indicative of the control signal delivered by the first isolated capacitor loop 210 and a second voltage $V_2$ indicative of the control signal CTL delivered by the second isolated capacitor loop 220. In the example of FIG. 6, the first isolated capacitor loop 210 includes: a first capacitor pair placed between a positive output terminal 101 (+) and a positive receive terminal 601 (+), and a second capacitor pair placed between a negative output terminal 102 (−) and a negative receive terminal 602 (−). The first capacitor pair may include a first capacitor 11 and a second capacitor 12, or the first capacitor pair may include only one of them (i.e. the first capacitor 11 or the second capacitor 12). The second capacitor pair may include a third capacitor 13 and a fourth capacitor 14, or the second capacitor pair may include only one of them (i.e. the third capacitor 13 or the fourth capacitor 14).

The second isolated capacitor loop 220 includes: a third capacitor pair placed between the negative output terminal 102 (−) and the negative receive terminal 602 (−), and a fourth capacitor pair placed between the positive output terminal 101 (+) and the positive receive terminal 601 (+). The third capacitor pair may include a fifth capacitor 15 and a sixth capacitor 16, or the third capacitor pair may include only one of them (i.e. the fifth capacitor 15 or the sixth capacitor 16). The fourth capacitor pair may include a seventh capacitor 17 and an eighth capacitor 18, or the fourth capacitor pair may include only one of them (i.e., the seventh capacitor 17 or the eighth capacitor 18).

In one embodiment of the present invention, the first capacitor pair and the second capacitor pair perform a differential transmission, and the third capacitor pair and the fourth capacitor pair also perform a differential transmission, to minimize disturbances.

In one embodiment of the present invention, the isolated drive circuit 600 further comprises: a first resistor 21, set between the positive receive terminal 601 and a secondary reference ground; and a second resistor 22, set between the negative receive terminal 602 and the secondary reference ground.

Figure 7:
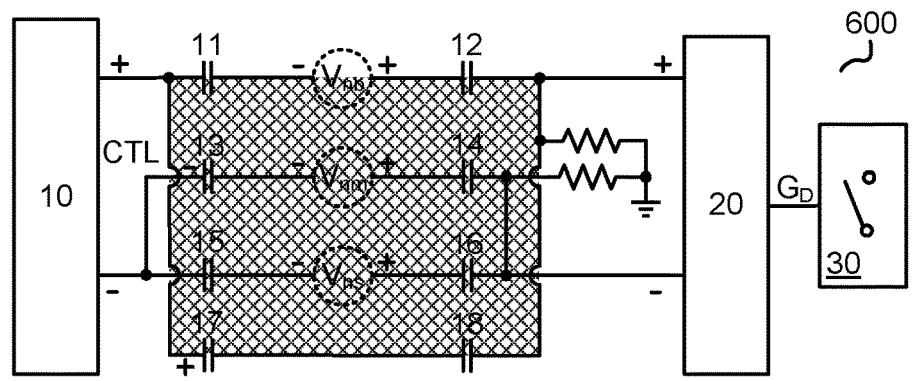
Figure 8:
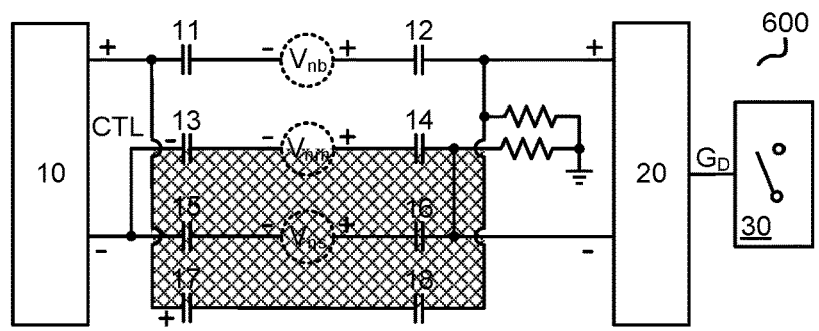
Figure 9:
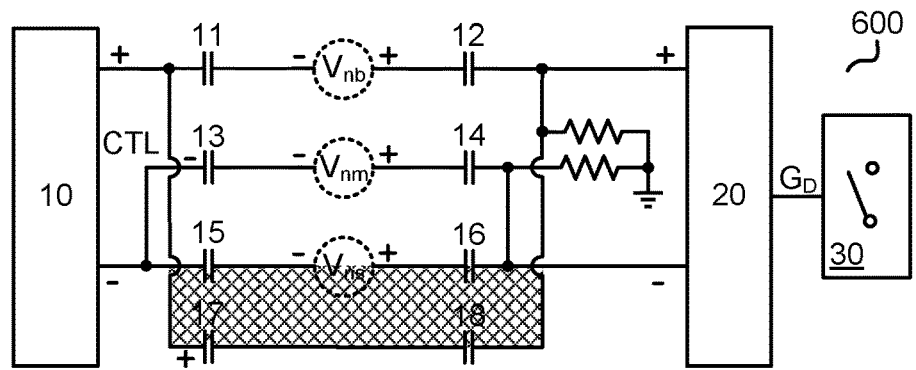
Figure 10:
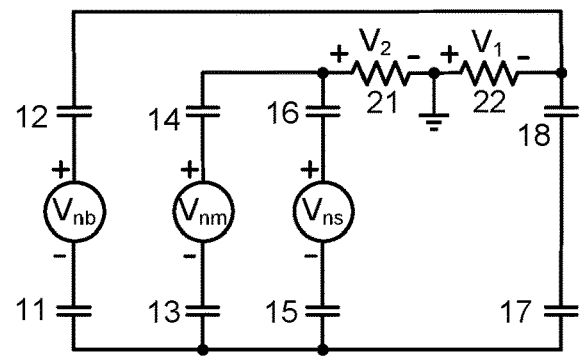
FIG. 10 schematically shows an equivalent circuit of the first resistor 21, the second resistor 22, and the first capacitor 11 to the eighth capacitor 18 of FIG. 6 in accordance with an embodiment of the present invention.

During the operation of the isolated drive circuit 600, if it is placed at an environment with a certain magnetic field, an induced voltage $V_{nb}$ would be generated at a big loop formed by the first capacitor 11, the second capacitor 12, the seventh capacitor 17 and the eighth capacitor 18. An induced voltage $V_{nm}$ would be generated at a middle loop formed by the third capacitor 13, the fourth capacitor 14, the seventh capacitor 17 and the eight capacitor 18. And an induced voltage $V_{ns}$ would be generated at a small loop formed by the fifth capacitor 15, the sixth capacitor 16, the seventh capacitor 17 and the eighth capacitor 18. The induced voltages $V_{nb}$, $V_{nm}$, and $V_{ns}$ are shown as voltage sources with dashed lines in FIG. 6. If the first isolated capacitor loop 210 has a physical area same as the second isolated capacitor loop 220, then the area (S1) of the big loop (the dashed area as shown in FIG. 7) is equal to a sum of the area (S2) of the middle loop (the dashed area as shown in FIG. 8) and the area (S3) of the small loop (the dashed area as shown in FIG. 9). That is, S1=S2+S3. Then, the induced voltage $V_{nb}$ generated by the big loop is equal to a sum of the induced voltage $V_{nm}$ generated by the middle loop and the induced voltage $V_{ns}$ generated by the small loop, i.e. $V_{nb}=V_{nm}+V_{ns}$. As a result, the voltages induced at the positive receive terminal and the negative receive terminal are counteracted with each other, and the influence caused by the magnetic field is eliminated. An equivalent circuit of the first resistor 21, the second resistor 22, and the first capacitor 11 to the eighth capacitor 18 is shown in FIG. 10.

In one embodiment of the present invention, an area of the loop formed by first capacitor 11, the second capacitor 12, the third capacitor 13 and the fourth capacitor 14, an area of the loop formed by the third capacitor 13, the fourth capacitor 14, the fifth capacitor 15 and the sixth capacitor 16, and an area of the loop formed by the fifth capacitor 15, the sixth capacitor 16, the seventh capacitor 17 and the eighth capacitor 18 are equal to each other.

Figure 11:
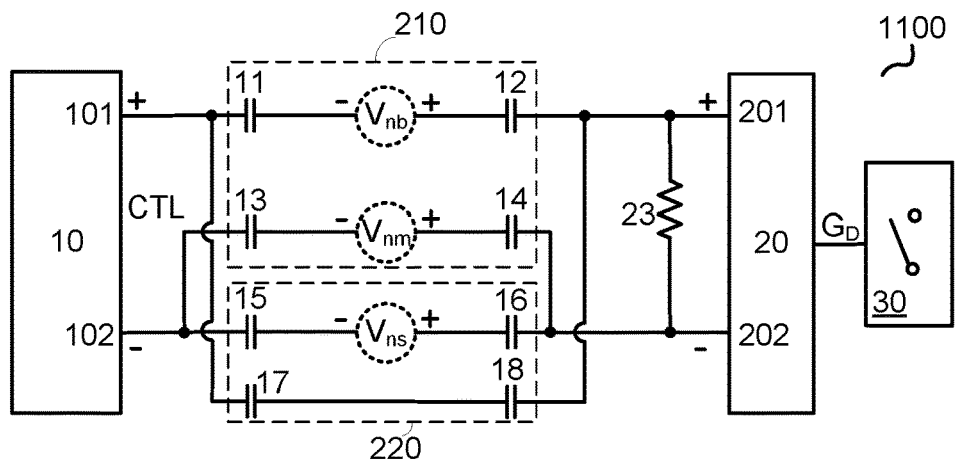
FIG. 11 schematically shows an isolated drive circuit 1100 in accordance with an embodiment of the present invention.
Figure 12:
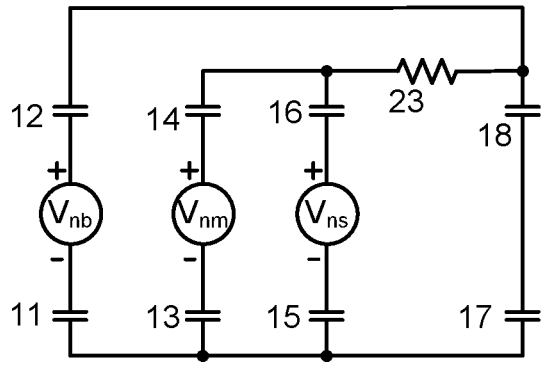
FIG. 12 schematically shows an equivalent circuit of the resistor 23, and the first capacitor 11 to the eighth capacitor 18 of FIG. 11 in accordance with an embodiment of the present invention.

In one embodiment of the present invention, the first resistor 21 and the second resistor 22 may be merged into one resistor 23, as shown in an isolated drive circuit 1100 in FIG. 11. The resistor 23 is set between the positive receive terminal 601 and the negative receive terminal 602 of the receiver 20. The other parts of the circuit configuration of the isolated drive circuit 1100 is similar to the isolated drive circuit 1000 in FIG. 10. An equivalent circuit of the resistor 23, and the first capacitor 11 to the eighth capacitor 18 is shown in FIG. 12.

Figure 13:
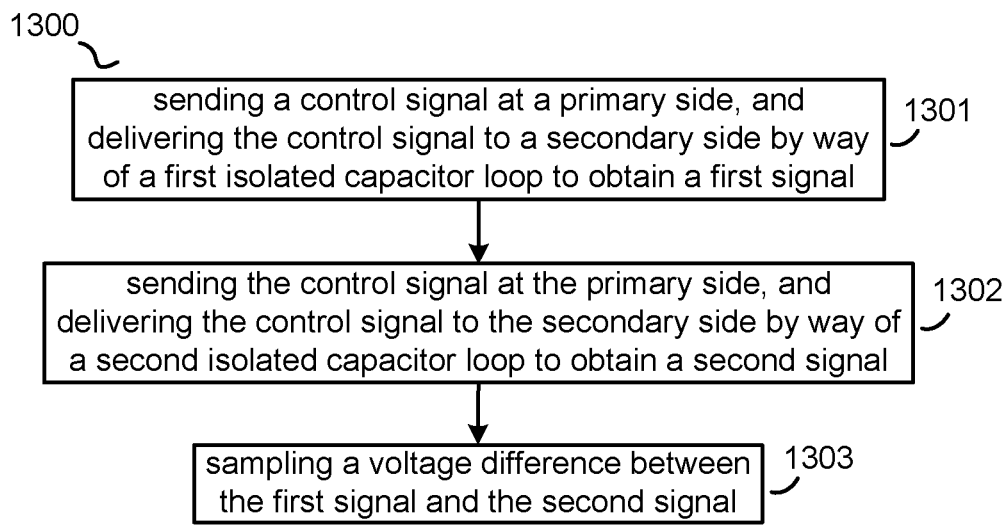
FIG. 13 schematically shows a flowchart 1300 of an isolated driving method in accordance with an embodiment of the present invention.

FIG. 13 schematically shows a flowchart 1300 of an isolated driving method in accordance with an embodiment of the present invention. The method comprises:

Step 1301, sending a control signal at a primary side, and delivering the control signal to a secondary side by way of a first isolated capacitor loop to obtain a first signal.

Step 1302, sending the control signal at the primary side, and delivering the control signal to the secondary side by way of a second isolated capacitor loop to obtain a second signal. And Step 1303, sampling a voltage difference between the first signal and the second signal.

In one embodiment of the present invention, the first isolated capacitor loop has a same area as the second isolated capacitor loop.

In one embodiment of the present invention, the first isolated capacitor loop comprises a first capacitor pair and a second capacitor pair placed between the primary side and the secondary side. The first capacitor pair and the second capacitor pair perform a differential transmission.

In one embodiment of the present invention, the second isolated capacitor loop comprises a third capacitor pair and a fourth capacitor pair placed between the primary side and the secondary side. The third capacitor pair and the fourth capacitor pair also perform a differential transmission.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. An isolated drive circuit, comprising:
   a transmitter at a primary side, configured to send a control signal;
   a first isolated capacitor loop and a second isolated capacitor loop placed between the transmitter and a receiver; and
   the receiver at a secondary side, configured to sample a voltage difference between a first voltage indicative of the control signal delivered by the first isolated capacitor loop and a second voltage indicative of the control signal delivered by the second isolated capacitor loop; wherein
   the first isolated capacitor loop comprises a first capacitor pair and a second capacitor pair placed between the primary side and the secondary side; and wherein
   the first capacitor pair and the second capacitor pair perform a differential transmission.

2. The isolated drive circuit of claim 1, wherein:
   the first isolated capacitor loop has a same area as the second isolated capacitor loop.

3. The isolated drive circuit of claim 1, wherein:
   the transmitter, the receiver, the first isolated capacitor loop and the second isolated capacitor loop are packaged together in a package outline.

4. The isolated drive circuit of claim 1, wherein:
   the transmitter has a positive output terminal and a negative output terminal;
   the receiver has a first receive terminal, a second receive terminal, a third receive terminal and a fourth receive terminal;
   the first isolated capacitor loop comprises: the first capacitor pair placed between the positive output terminal of the transmitter and the first receive terminal of the receiver, and the second capacitor pair placed between the negative output terminal of the transmitter and the second receive terminal of the receiver; and
   the second isolated capacitor loop comprises: a third capacitor pair placed between the negative output terminal of the transmitter and the third receive terminal of the receiver, and a fourth capacitor pair placed between the positive output terminal of the transmitter and the fourth receive terminal of the receiver.

5. The isolated drive circuit of claim 4, wherein:
   each of the first capacitor pair, the second capacitor pair, the third capacitor pair and the fourth capacitor pair includes one capacitor or two capacitors.

6. The isolated drive circuit of claim 4, further comprising:
   a first resistor, placed between the first receive terminal and the second receive terminal of the receiver; and
   a second resistor, placed between the third receive terminal and the fourth receive terminal of the receiver.

7. The isolated drive circuit of claim 1, wherein:
   the transmitter has a positive output terminal and a negative output terminal;
   the receiver has a positive receive terminal and a negative receive terminal;
   the first isolated capacitor loop comprises: the first capacitor pair placed between the positive output terminal of the transmitter and the positive receive terminal of the receiver, and the second capacitor pair placed between the negative output terminal of the transmitter and the negative receive terminal of the receiver; and
   the second isolated capacitor loop comprises: a third capacitor pair placed between the negative output terminal of the transmitter and the negative receive terminal of the receiver, and a fourth capacitor pair placed between the positive output terminal of the transmitter and the positive receive terminal of the receiver.

8. The isolated drive circuit of claim 7, wherein:
   each of the first capacitor pair, the second capacitor pair, the third capacitor pair and the fourth capacitor pair includes one capacitor or two capacitors.

9. The isolated drive circuit of claim 7, further comprising:
   a resistor, placed between the positive receive terminal and the negative receive terminal of the receiver.

10. The isolated drive circuit of claim 7, further comprising:
    a first resistor, placed between the positive receive terminal of the receiver and a reference ground; and
    a second resistor, placed between the negative receive terminal of the receiver and the reference ground.

11. An isolated drive circuit, comprising:
    a first transmit circuit and a second transmit circuit, respectively configured to provide a first control signal and a second control signal;
    a first isolated capacitor loop, placed between the first transmit circuit and a receiver;
    a second isolated capacitor loop, placed between the second transmit circuit and the receiver; and the receiver, configured to sample a voltage difference between a first voltage indicative of the first control signal delivered by the first isolated capacitor loop and a second voltage indicative of the second control signal delivered by the second isolated capacitor loop; wherein the first isolated capacitor loop comprises a first capacitor pair and a second capacitor pair placed between the primary side and the secondary side; and wherein the first capacitor pair and the second capacitor pair perform a differential transmission.

12. The isolated drive circuit of claim 11, wherein:

the first transmit circuit, the second transmit circuit, the receiver, the first isolated capacitor loop and the second isolated capacitor loop are packaged together in a package outline.

13. The isolated drive circuit of claim 11, wherein:

the first isolated capacitor loop has a same area as the second isolated capacitor loop.

14. The isolated drive circuit of claim 11, wherein:

the first transmit circuit and the second transmit circuit respectively has a positive output terminal and a negative output terminal;

the receiver has a first receive terminal, a second receive terminal, a third receive terminal, and a fourth receive terminal;

the first isolated capacitor loop includes: the first capacitor pair placed between the positive output terminal of the first transmit circuit and the first receive terminal of the receiver, and the second capacitor pair placed between the negative output terminal of the first transmit circuit and the second receive terminal of the receiver; and the second isolated capacitor loop includes: a third capacitor pair placed between the negative output terminal of the second transmit circuit and the third receive terminal of the receiver, and a fourth capacitor pair placed between the positive output terminal of the second transmit circuit and the fourth receive terminal of the receiver.

15. The isolated drive circuit of claim 14, further comprising:

a first resistor, placed between the first receive terminal and the second receive terminal of the receiver; and a second resistor, placed between the third receive terminal and the fourth receive terminal of the receiver.

16. The isolated drive circuit of claim 14, wherein:

each of the first capacitor pair, the second capacitor pair, the third capacitor pair and the fourth capacitor pair includes one capacitor or two capacitors.

17. An isolated driving method, comprising:

sending a control signal at a primary side, and delivering the control signal to a secondary side by way of a first isolated capacitor loop to obtain a first signal;

sending the control signal at the primary side, and delivering the control signal to the secondary side by way of a second isolated capacitor loop to obtain a second signal; and sampling a voltage difference between the first signal and the second signal; wherein the first isolated capacitor loop comprises a first capacitor pair and a second capacitor pair placed between the primary side and the secondary side; and wherein the first capacitor pair and the second capacitor pair perform a differential transmission.

18. The isolated driving method of claim 17, wherein:

the first isolated capacitor loop has a same area as the second isolated capacitor loop.

19. The isolated driving method of claim 17, wherein:

the second isolated capacitor loop comprises a third capacitor pair and a fourth capacitor pair placed between the primary side and the secondary side; and wherein the third capacitor pair and the fourth capacitor pair also perform a differential transmission.

* * * * *